United States Patent [19]
Fields et al.

[11] Patent Number: 6,085,077
[45] Date of Patent: Jul. 4, 2000

[54] HARDWARE EFFICIENT DIGITAL CHANNELIZED RECEIVER

[76] Inventors: Timothy W. Fields, 12 Rockrose Ct., Westfield, Ind. 46074; Daniel R. Zahirniak, 8700 Christygate La., Huber Heights, Ohio 45424; David L. Sharpin, 2748 Old Oak La., Springfield, Ohio 45503

[21] Appl. No.: 08/816,951

[22] Filed: Jan. 21, 1997

[51] Int. Cl.$^7$ ...................................... H04B 1/10
[52] U.S. Cl. .......................... 455/303; 455/307; 455/337; 455/226.1; 342/13
[58] Field of Search ............... 455/226.1, 226.2, 455/189.1, 191.1, 205, 206, 207, 214, 313, 334, 337, 132, 303.7; 375/340, 260; 370/210, 208; 342/13, 21, 196; 324/77.11, 77.28, 77.29, 77.31

[56] References Cited

U.S. PATENT DOCUMENTS

| | | | |
|---|---|---|---|
| 4,547,727 | 10/1985 | Tsui et al. .............................. | 342/13 X |
| 5,499,391 | 3/1996 | Tsui ...................................... | 455/226.2 |
| 5,535,240 | 7/1996 | Carney et al. ........................ | 375/260 X |
| 5,606,575 | 2/1997 | Williams .............................. | 375/260 X |

OTHER PUBLICATIONS

L.R. Rabiner, R.E. Crochiere "Multirate Digital Signal Processing" Prentiss Hall, Englewood Cliffs, NJ, 1983.

*Primary Examiner*—Wellington Chin
*Assistant Examiner*—Philip J. Sobutka

[57] ABSTRACT

The present invention documents a digital channelized receiver for signal intercept applications. A hardware efficient implementation of a uniform filter bank in which the number of filters, K, is greater than the decimation factor, M, is provided. By optimizing the filter bank frequency response, in conjunction with K and M, the proposed invention allows a simple channel arbitration logic to be implemented. In addition, the present invention provides reliable instantaneous frequency measurements and parameter estimates across the desired frequency range while reducing the data processing speed requirements by a factor of M.

18 Claims, 13 Drawing Sheets

Microfiche Appendix Included
(6 Microfiche, 346 Pages)

HARDWARE EFFICIENT DIGITAL CHANNELIZED RECEIVER

RIGHTS OF THE GOVERNMENT

The invention described herein may be manufactured and used by or for the Government of the United States for all governmental purposes without the payment of any royalty.

MICROFICHE APPENDIX

This document includes a non-printed computer program listing which is disclosed in the form of a microfiche appendix as provided for in 37 CFR 1.96(b) and MPEP section 608.05. This appendix consists of 346 pages or frames located on a total of 6 microfiche.

BACKGROUND OF THE INVENTION

In radio frequency signal intercept applications, several highly desirable characteristics of the intercept receiver include broad band instantaneous frequency coverage, good sensitivity, good dynamic range, simultaneous signal detection, arbitration and parameter encoding, and fine frequency measurement. Further, in electronic warfare applications, the characteristics must be attainable with a goal toward minimal hardware and reduced signal processing speed.

The receiver architecture which covers most of these characteristics is the channelized receiver architecture. This channelized receiver comprises an antenna and a radio frequency front end which, respectively, intercept radio frequency energy and perform signal conditioning and down conversion to a convenient intermediate frequency. In order to widen a radio frequency bandwidth to improve the probability of intercept, the channelized receiver uses a number of contiguous filters, a filter bank, to sort the input signal into segments of predetermined frequency. An input signal with a certain frequency will fall into a certain filter. By measuring the output of the filters, the input signal frequency is estimated. The analog channelized receiver is expensive to fabricate because of the large number of filters required. Further, the receiver size is bulky and its maintenance is difficult because of the large number of components used.

Similarly, the digital form of a channelized receiver requires a contiguous set of digital band pass filters with linear phase that cover the intermediate frequency bandwidth. This coverage could be accomplished with a set of discrete digital filters; however, the digital filter bank can also be effectively implemented by performing the short time Fourier transform which in effect performs the discrete Fourier transform on weighted and overlapped partitions of a collection of discrete time signals. Using this approach, the short time Fourier transform complex modulates a low pass filter h(n) to form a uniform filter bank having one filter centered at each frequency bin of the fast Fourier transform. The low pass filter h(n) is, in effect, used to window the data. The established window slides across the data and then the discrete Fourier transform is calculated to give a frequency versus time output. Between successive fast Fourier transform calculations, M points are skipped which results in the output being decimated in time by M. It is also possible to generate a fine frequency digital channelized receiver by using an instantaneous frequency measurement algorithm. Such an instantaneous frequency measurement receiver uses the phase data generated by the short time Fourier transform filter bank to generate the fine frequency selection capability of the digital channelized receiver. The concept of a digital, channelized instantaneous frequency measurement receiver is known and is described in U.S. Pat. No. 5,499,391 by Tsui which is hereby incorporated herein by reference.

The digital channelized receiver, however, has limitations. The first limitation is caused by the structure of the filter bank and the pulsed nature of the input signals. In order to have continuous coverage across the instantaneous bandwidth, adjacent channel responses are overlapped to a large degree. In this respect, the channelized receiver acts like a spectrum analyzer. Thus, there is a great deal of crosstalk between the channels, even when the input is a simple continuous wave signal. This situation is exacerbated when a pulsed signal is input because the leading and trailing edges of the pulse contain a great deal of broad band energy which spills into adjacent and non-adjacent channels. The result is known as the "rabbit ear effect" because the out-of-channel, time-domain output responses have a peak on the leading and trailing edges of the pulse due to the impulse response of the filters. Due to these combined effects there is a second limitation; some method must be used to "arbitrate" between the filter channels and determine in which channel the input signal truly resides. The remaining responses are then classified as out-of-channel responses and discarded.

The frequency resolution capability or the ability to resolve and process two signals closely spaced in frequency, is limited by the receiver's arbitration capability. Currently, techniques such as amplitude comparison of adjacent channels and techniques that detect the presence of the "rabbit-ear" effect have been used to perform channel arbitration. Both of these approaches use only the amplitudes of filter bank outputs and have inherent limitations. Implementation of a known architecture, described by L. R. Rabiner and R. E. Crochiere in "Multi-Rate Digital Signal Processing", Prentis Hall, Englewood Cliffs, N.J., 1983, which could provide accurate arbitration capability, requires an inefficient number of decimators, expanders and polyphase filter components to be practical within the context of the digital receiver.

SUMMARY OF THE INVENTION

The present invention provides a hardware efficient solution for the digital receiver channel arbitration and frequency-resolution requirements mentioned in the background section. This invention solves the problem of high computational intensity by decimating the data by a factor of M prior to input to the filter bank. Accurate channel arbitration and frequency measurement is obtained by implementing an optimal relationship between each filter's frequency response, the decimation rate M and the number of filters in the receiver. This optimal relation allows simple arbitration logic to be implemented which further reduces computer processing requirements. The optimal filter bank structure of the present invention has several hardware advantages over the known architecture based on Rabiner and Crochiere. First, only K/2 unique demultiplexer data outputs are required as opposed to K. This is very important since the number of demultiplexer output lines, and hence finite impulse response inputs, can become large for even modest filter bank sizes. Integration of functions on a single integrated circuit chip is limited not by circuit density but by physical input/output requirements. Reducing the demultiplexer outputs also reduces the required circuitry and power dissipation. Also, each polyphase filter is required to store half as many coefficients. This is due to the fact that there are K unique filters in which to distribute the prototype filter coefficients as opposed to K/2. This leads to a reduction in silicon area required to implement the filters.

An object of the present invention is, therefore, to provide a hardware efficient digital channelized receiver for signal intercept applications.

It is another object of the present invention to implement a uniform filter bank in which the number of filters, K, is greater than the decimation factor, M.

It is a feature of the present invention to provide reliable instantaneous frequency measurements, even in adjacent channel crossover regions.

It is an advantage of the present invention to provide an optimal relationship between the filter bank frequency response, decimation rate and arbitration logic to allow channel arbitration to be accomplished accurately and with minimum hardware requirements.

Additional objects and features of the invention will be understood from the following description and claims, and the accompanying drawings.

These and other objects of the invention are achieved by a hardware efficient digital channelized receiver comprising:
frequency converter means connected to a radio frequency input signal source for converting said input signals to signals of a lower intermediate frequency;
analog-to-digital converter means coupled to said frequency converter means for converting said lower intermediate frequency signals into digital signals;
decimating means coupled to said analog-to-digital converter means for reducing the processing speed requirements of each said digital signal by a factor M;
fast Fourier transform implementation of the inverse discrete Fourier transform inclusive digital filter bank means containing K number of polyphase bandpass filters coupled to said decimating means for generating a plurality of polyphased digital channel signals from said scaled digital signals;
means, including a plurality of exponential operator-inclusive modulators coupled to individual channel outputs of said K number of polyphase bandpass filters for translating said channelized digital signals from bandpass frequencies to baseband frequencies of selected limited frequency spectrum;
converter means coupled to said fast Fourier transform implementation of the inverse discrete Fourier transform inclusive digital filter bank means for converting said plurality of polyphased digital channel signals into phase component signals and magnitude component signals;
signal detection logic means having inputs coupled to said converter means magnitude component signals;
digital instantaneous frequency measurement means coupled to said signal detection logic means for processing said converter means phase component signals from to instantaneous frequency signals; and
arbitration means coupled to output signals of said digital instantaneous frequency measurement means for segregating valid from invalid averaged signals therefrom, said segregation being based on the location of a signal within or without of a channel.

DETAILED DESCRIPTION

Figure 1:
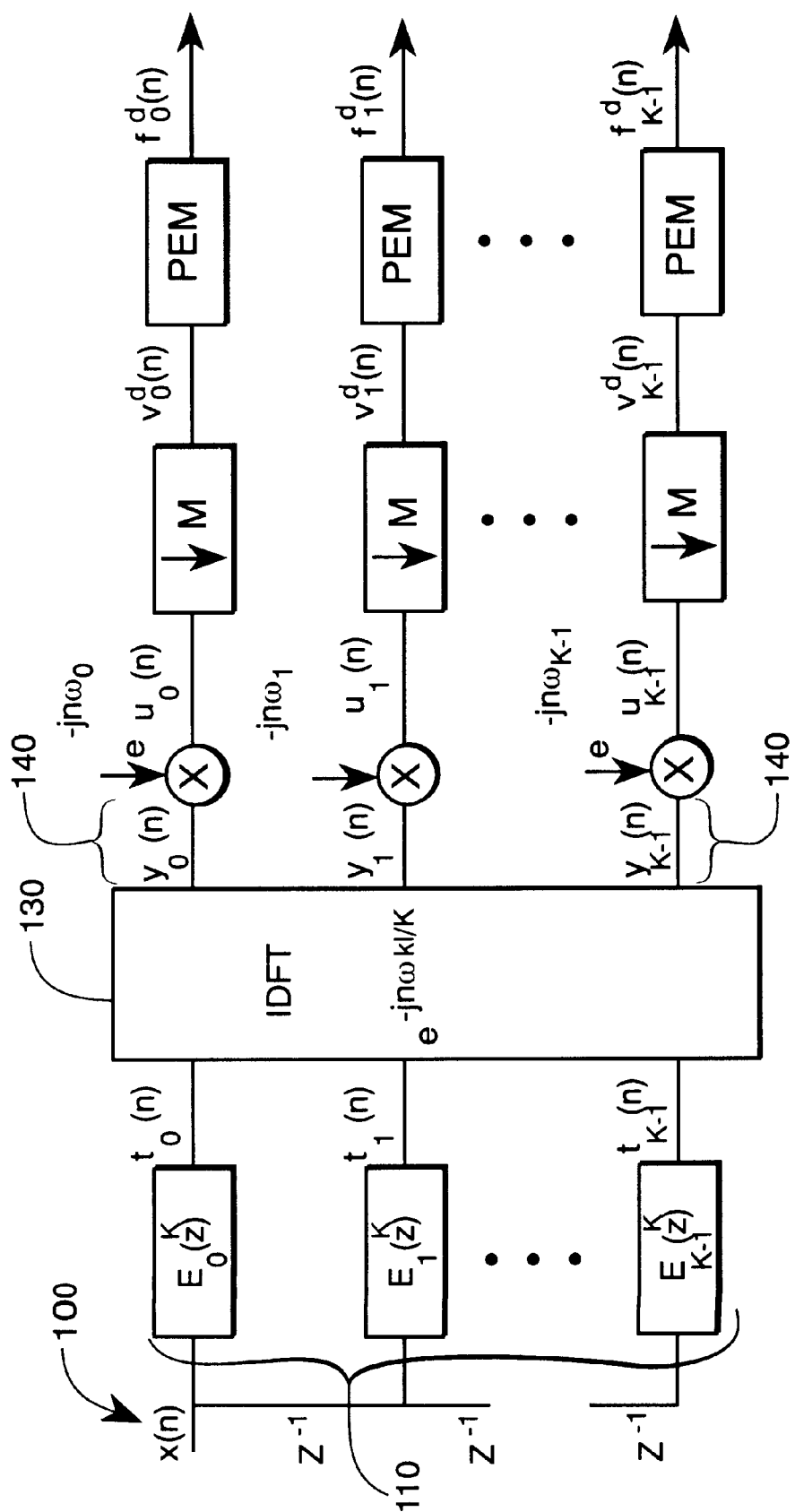
FIG. 1 shows polyphase decomposition of an input signal followed by Inverse Discrete Fourier Transform, modulation, decimation and instantaneous frequency measurement operations.

The present invention provides a digital channelized receiver capable of unambiguous signal detection in a manner that minimizes hardware requirements and processing time and energy. This is accomplished by using a reliable and accurate instantaneous frequency measurement in the channel crossover regions and arbitration logic based solely on instantaneous frequency measurements; an arrangement made possible by an optimum relation between the number of filters K, the frequency response of the prototype filter and the data decimation factor M. Simulations of the filter bank structure and performance of the arbitration logic and frequency estimation are accomplished using the computer software routines including phasdiff.m, polycofz.m, polydec.m, polyfilt.m, polyzf.m and obr.m using the hardware simulation software known as MATLAB; the relevant computer programs are included as an appendix to this application. The simulation results presented in source code are a part of a larger simulation program, included in the microfiche appendix, which includes the noise effects of a digital receiver front end, an analog-to-digital-converter quantization, jitter noise effects and outputs of all pulse parameter. All computations are performed using floating point arithmetic with the effective number of bits of the analog-to-digital converter set to eight.

The structure of the present invention includes a radio frequency receiving front end, an analog-to-digital converter, decimators, a bank of polyphase band pass filters, parameter encoder module (PEM) containing instantaneous frequency measurement (IFM) means and means for implementing a novel arbitration algorithm. The front end samples data from the frequency range of interest by first passing the data through an antialiasing bandpass filter, spanning the frequency range of interest, and then sending all signals within the desired frequency range to an analog-to-digital converter. Because the present invention is a digital channelized receiver, an analog-to-digital converter converts the sampled signals from analog to digital form and does so while maintaining a constant signal-to-noise plus distortion ratio across the frequency band of operation. The digitized data is shown as x(n) at 100 in FIG. 1. The appendix program which runs the digital channelized receiver simulation is digrcvr.m. This program initializes signal parameters and analog-to-digital converter values.

Following the analog-to-digital converter is a filter bank whose purpose is to provide broad band instantaneous frequency coverage and allow for simultaneous signal detection. The filter bank partitions the frequency range of interest into K specific frequency bands through the action of K bandpass filters. The frequency range of interest is determined by the frequency range of the antialiasing filter. For the present digital receiver, each of these bandpass filters is mathematically derived from a single prototype filter. Let h(n) be a causal, symmetric low-pass filter of length N with real coefficients given by $$h_0(n) = \{h(0)\ldots h(N-1)\} \quad \text{Eq. 1}$$

In the computer simulation, K was set to 32, a cutoff frequency was set to $\pi/32$ and a stopband frequency was set to $2\pi/32$. Additionally, in the computer simulation, the prototype filter $h_0[n]$ coefficients were obtained using the Parks-McClellan filter algorithm which configures an optimum filter when the filter constraints (desired frequency and number of coefficients) are provided. The computer simulation filter configuration consists of 256 coefficients which results in 8 coefficients per polyphase component.

Figure 2:
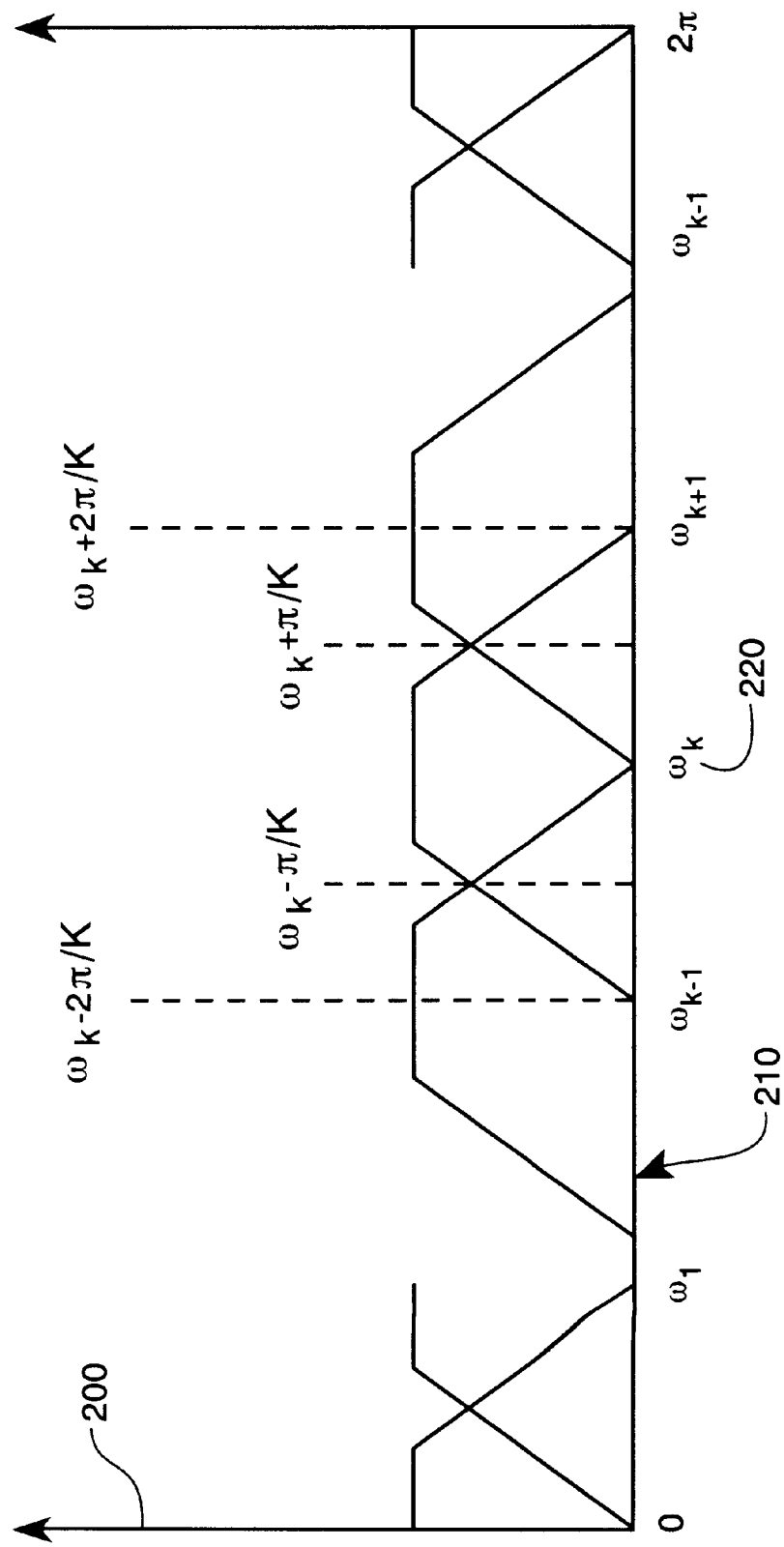
FIG. 2 shows a filter bank magnitude response.

After transforming into the z-domain, the prototype filter of the present invention is decomposed into K polyphase components $E_k(z)$, illustrated at 110 in FIG. 1, as $$H_0(z) = \sum_{l=0}^{K-1} z^{-l} E_l(z^K) \quad \text{Eq. 2}$$

where $$E_l(z^K) = \sum_{n=0}^{P-1} h_0[nK + l] z^{-nK} \quad \text{Eq. 3}$$

where P=N/K is the length of the $l^{th}$ polyphase filter and where K-1 zeros exist between the successive filter coefficients. A polyphase component is a filter constructed from a portion of the prototype filter. Properly recombining all polyphase components will reconstruct the prototype filter. The number of components, or K, used in any one filter bank is based on the number of filters used to partition the digital frequency range between frequencies of zero and $2\pi$. The length of the prototype filter, or K—i.e., the number of polyphase components, is predetermined and based upon the bandwidth of each channel and the minimum pulse width required. The polyphase filters are zero-padded in order to properly reconstruct the prototype. FIG. 2 shows an ideal magnitude response for the filter bank of the computer simulation. The figure illustrates the optimal relation of the filter bank frequency response. The vertical axis at 200 in FIG. 2 represents magnitude response normalized to unit gain; the horizontal axis at 210 represents radian digital frequency.

The filter bank derived above could be implemented by a set of K identically produced filters with each filter having N coefficients, however, in the present invention, an inverse discrete Fourier transform is employed to perform the K-point Fast Fourier Transform on the K polyphase components by using only one prototype filter to obtain the output of the kth filter. A fast Fourier transform implementation of the inverse discrete Fourier transform evaluated as K equally spaced frequencies is implemented, as illustrated at 130 in FIG. 1, as a filter bank with K filters centered at $w_k=2\pi k/K$ for efficiency.

The combined operations of polyphase decomposition as described above in the polyphase filter bank derivation and the inverse discrete Fourier transform effectively modulates or transforms the prototype filter and thereby produces a set of K bandpass filters centered at $w_k=2\pi k/K$. The appendix program polycofz.m decomposes the filter coefficients into the K polyphase filters $E_l[z]$. Decomposing the filters from low pass to bandpass this way allows exploitation of the novel decimation of the present invention described below. By way of further explanation, the above described transformation of producing band pass filters centered at $w_k=2\pi k/K$ can be mathematically shown by letting $y_k[n]$ be the output of the $k^{th}$ channel of the inverse discrete Fourier Transform matrix at time n as shown at 140 in FIG. 1. From FIG. 1

$$y_k[n] = \sum_{l=0}^{K-1} t_l[n] e^{j2\pi lk/K} \quad \text{for } k = 0 \ldots K-1 \quad \text{Eq. 4}$$

where $t_l[n]$ is the output of the $l^{th}$ polyphase component. Transforming from the time domain to the z-domain illustrates the transfer function between $y_k[n]$ and $x[n]$. Therefore, $y_k[n]$ is the output of a bandpass filter centered at $w_k=2\pi k/K$ as shown in FIG. 2 at 220. Thus, $$Y_k(z) = \sum_{l=0}^{K-1} e^{j2\pi kl/K} z^{-l} E_l(z^K) X(z) \quad \text{Eq. 5}$$

so that the transfer function for the kth channel can be written as $$H_k(z) = \frac{Y_k(z)}{X(z)} = \sum_{l=0}^{K-1} (e^{-j2\pi k/K} z)^{-l} E_l(z^k) \quad \text{Eq. 6}$$

Evaluating Eq. 2 at $z=ze^{-j2\pi k/K}$, since $(e^{-j2\pi k/K} Z)^K = Z^K$, then the prototype filter is modulated by $e^{-j2\pi k/K}$ as follows $$H_k(z) = H_0(z e^{-j2\pi k/K}) \quad \text{Eq. 7}$$

For electronic warfare applications, the desired speed at which sampled data can be processed through a digital receiver is usually much slower than the data rate of the sampled signals. In order to reduce the data rate, the data can be decimated by a factor M to allow phase extraction and frequency determination at a slower rate. In the present invention, in order to reduce the speed at which the filter bank operates, M-fold decimators are placed at the input of the polyphase filters as shown at 300 in FIG. 3. The feasibility of placing decimators at the input of the filter bank can be understood using a mathematical illustration first considering them at the output of the modulators and then transforming them to the input of the filter bank.

Placing the M-fold decimators at the inputs of the polyphase components is derived by considering that decimating the output of the $l^{th}$ polyphase filter gives the sequence $t_l^d[n]=t_l[Mn]$ so that $$T_l(z) = \frac{1}{M} \sum_{m=0}^{M-1} T_l\left(z^{\frac{1}{M}} e^{-j2\pi m/M}\right) = \quad \text{Eq. 8}$$

$$\frac{1}{M} \sum_{m=0}^{M-1} E_l\left(z^{\frac{K}{M}} e^{-j2\pi Km/M}\right) X\left(z^{\frac{1}{M}} e^{-j2\pi m/M}\right) \left(z^{\frac{1}{M}} e^{-j2\pi m/M}\right)^{-l}$$

Since F=K/M is an integer and $e^{-j2\pi Km/M}=1$ for all integers m $$T_l(z) = E_l(z^F) \frac{1}{M} \sum_{m=0}^{M-1} X\left(z^{\frac{1}{M}} e^{-j2\pi m/M}\right)\left(z^{\frac{1}{M}} e^{-j2\pi m/M}\right)^{-l} \quad \text{Eq. 9}$$

Figure 3:
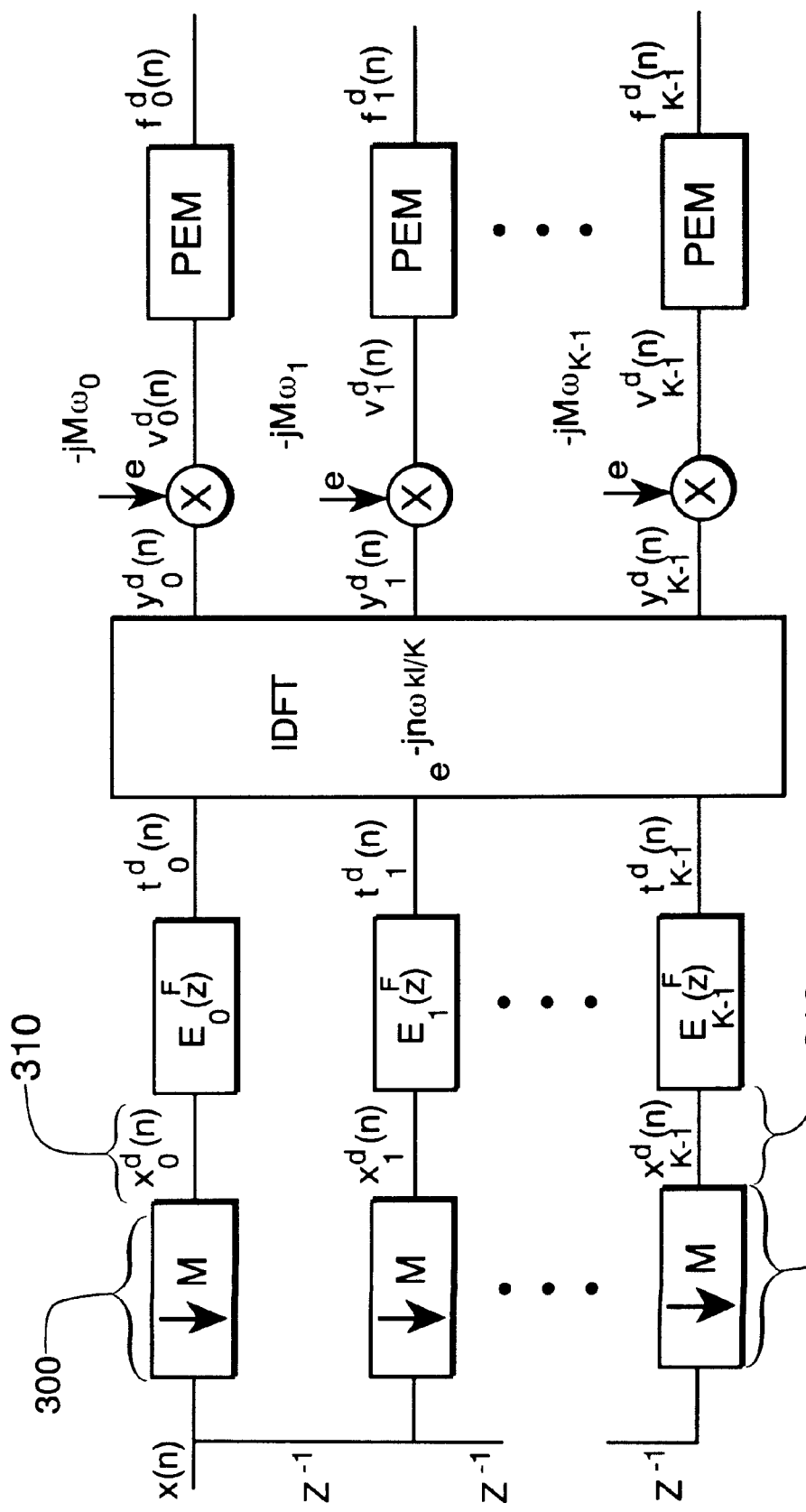
FIG. 3 shows a polyphase filter bank with translated decimators according to the present invention.

This is equivalent to replacing the filter $E_l(z^k)$ with $E_l(z^F)$ and moving the M fold decimator to the front of the filter bank as shown at 300 in FIG. 3. The program polyzf.m creates the inverse discrete Fourier transform filter bank with K channels and the output decimated by M in the accompanying computer simulation.

By further illustration, the feasibility of moving the decimators to the input of the filter bank can be seen in the time domain. The decimated output of each polyphase component is written as $$t_l^d[n] = \sum_{p=0}^{P-1} h_0[l + pK]x[Mn - l - pK] \quad \text{Eq. 10}$$

The inverse discrete Fourier transform output is then $$y_k[n] = \sum_{l=0}^{K-1}\sum_{p=0}^{P-1} h_0[l + pK]x[Mn - l - pK]e^{j2\pi kl/K} \quad \text{Eq. 11}$$

Considering the feasibility in the time domain shows that this is exactly equivalent to multiplying a block of N data points by the filter coefficients and performing a fast Fourier transform on the data, then sliding the window by M and repeating the process until all data points are processed. This equivalency allows the architecture of the present invention to be implemented as an overlapping of input data by a factor of two, where F is the data overlap factor. Moving the decimators to the input of the filter bank reduces the zero-padding factor from K-1 to F-1 and in turn reduces the number of calculations and the speed by 1/M.

Implementation of the present invention by overlapping data input to the filter bank by a factor of two can be illustrated mathematically. Using Eq. 11, we can define the data outputs of the decimators as shown in FIG. 3 at 310 as $$x_l[n] = x[Mn-l] \quad \text{Eq. 12}$$

for l=0 . . . . K-1. For F=2, the data distribution to the polyphase filters can be split into two subsets given by:

$$x_{l_1}[n] = x[Mn - l_1] \text{ for } l_1 = 0,1, \ldots K/2-1 \quad \text{Eq. 13}$$

$$x_{l_2}[n] = x_{l_1}[n-1] \text{ for } l_2 = l_1 + K/2 \quad \text{Eq. 14}$$

Figure 4:
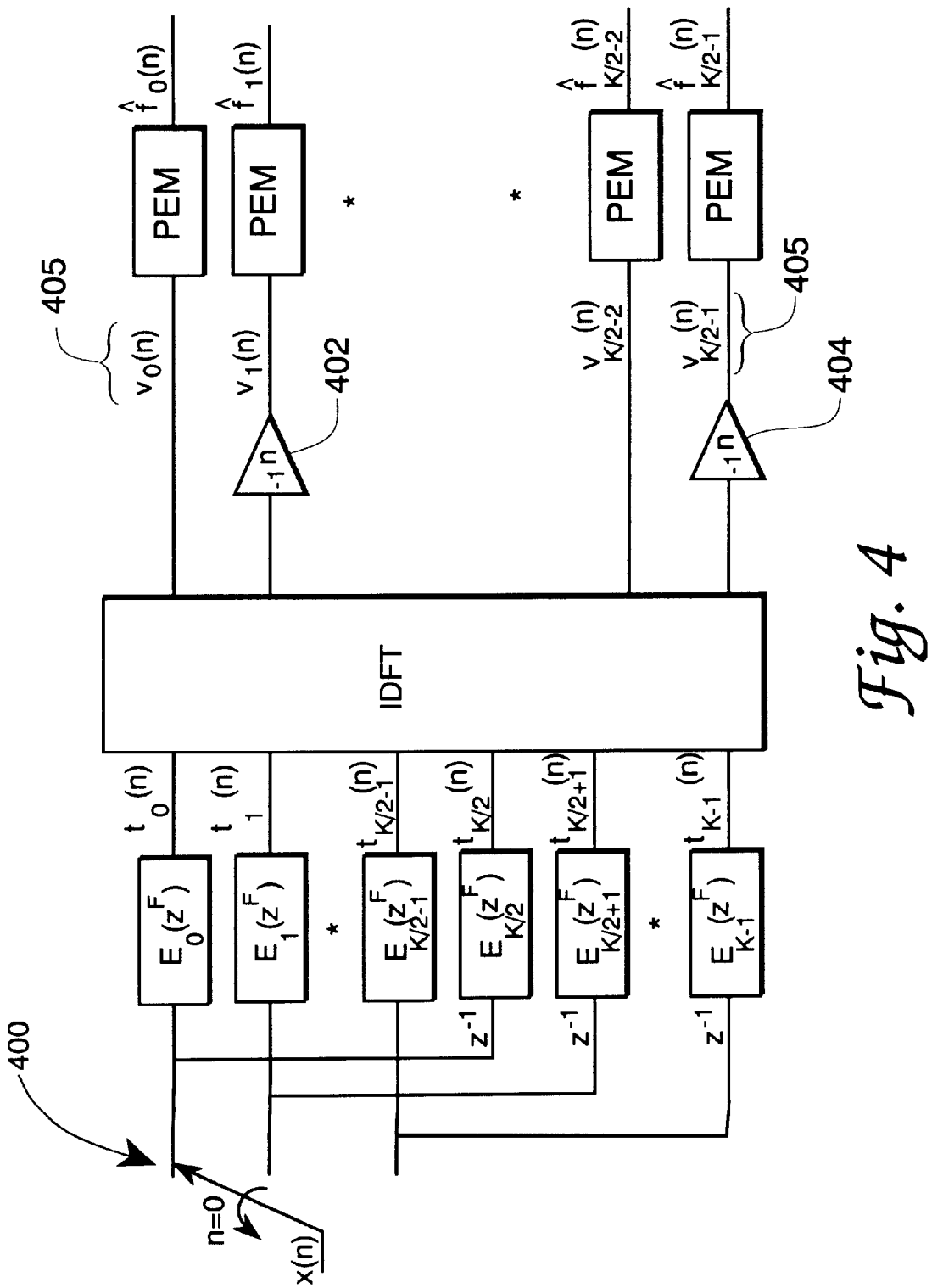
FIG. 4 shows a polyphase filter bank commutator diagram according to the present invention.

The data can be split into two subsets because the decimated data entering polyphase filters $E_{K/2}(z^F)$ through $E_{K-1}(z^F)$ is a one sample delayed version of the data entering the filters $E_0(z^F)$ through $E_{K/2-1}(z^F)$, illustrated at 400 in FIG. 4. From Eq. 7, the exponential term, $e^{-j2\pi kMn/K}$, which provides the modulation of each channel to baseband reduces, for F=2 to $$e^{-j2\pi kn} = \begin{cases} 1 & \text{for } k \text{ even} \\ (-1)^n & \text{for } k \text{ odd} \end{cases} \quad \text{Eq. 15}$$

Using the above equations, FIG. 3 can be redrawn as shown in FIG. 4. In this model of the filter bank of the present invention, input data is commutated in a counterclockwise fashion only to the upper K/2 polyphase filter channels. The lower K/2 channels receive a delayed set of the upper K/2 channel inputs. The commutator 400 of FIG. 4 can be implemented using a 1:K/2 demultiplexer as shown at 510 in FIG. 5; the unit delays, 402 and 404 in FIG. 4, by storage registers. The number of output channels is K/2 or 16 which is half of the polyphase components of the filter bank because real sinusoids can be uniquely defined in terms of a complex exponential from $0 \leq w_0 \leq \pi$. This data input processing method is performed in the computer software by polydec.m which delays and decimates the signals x[n] by M and places them into the filters $E_i[z]$. Also, the program polyfilt.m performs the actual filtering of the data with the K polyphase filters. The polyphase filters, defined by Eq. 10, can each be implemented in direct transpose form because they are finite impulse response filters requiring N multipliers, N-1 addresses and 2N delays. Alternating coefficients are zeros because the polyphase representation of $z^F$, where F=2, effectively inserts two delays for a single delay defined by $z^{-1}$ which allows the elimination of associated multiplications and additions required for nonzero filter coefficients. Thus, even though the original prototype filter $h_0[n]$ of length N, is effectively zero padded to length 2N, the number of required multiplications and additions is N and N-1, respectively. Decimation by M thereby greatly reduces processing speed and energy.

Figure 5:
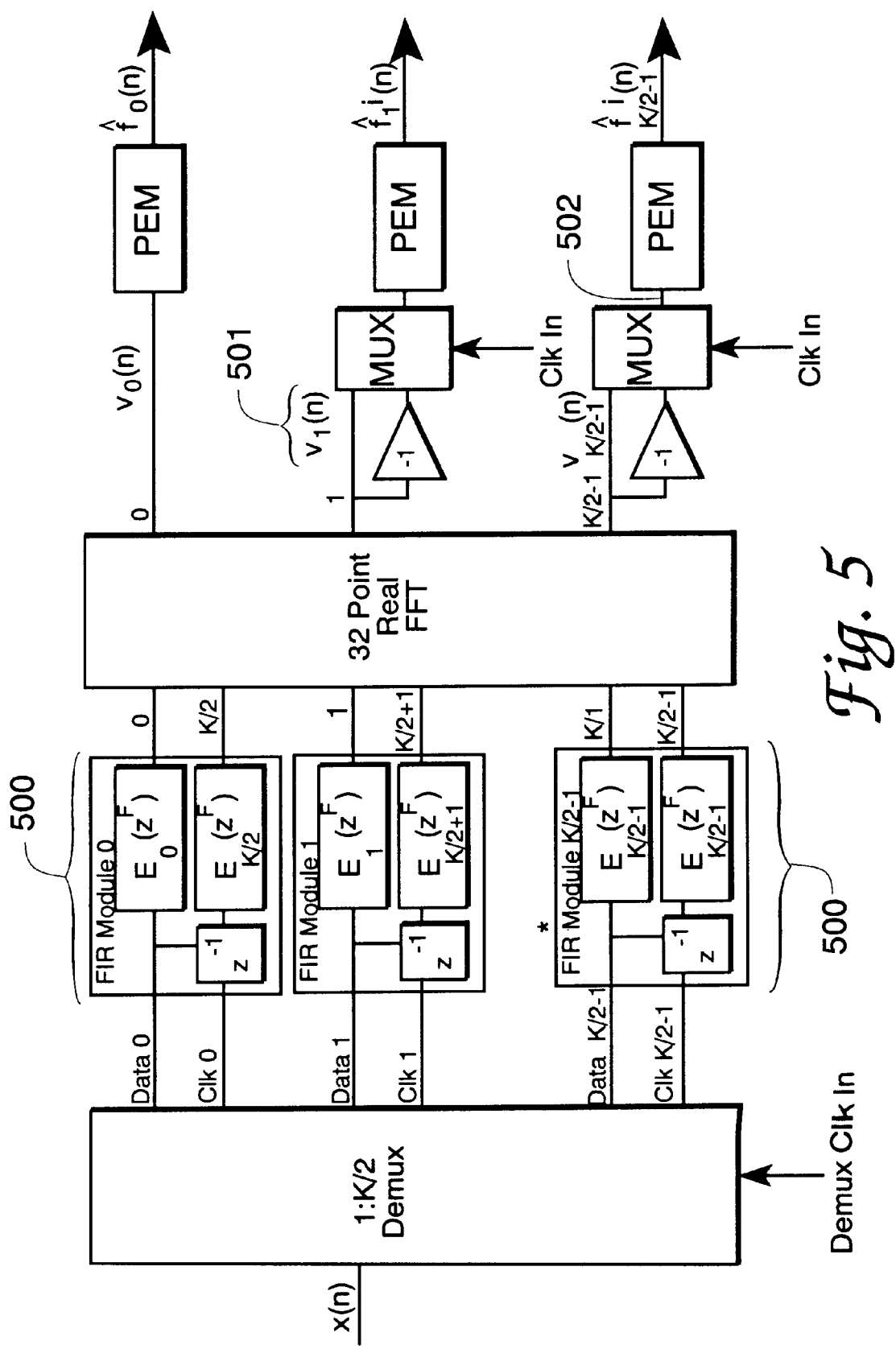
FIG. 5 shows a polyphase filter bank hardware block diagram according to the present invention.

FIG. 5 shows a digital hardware implementation of the filter bank. In FIG. 5, the polyphase filters in each finite impulse response filter module at 500 are grouped such that the delay elements are included in the filter module, thus reducing input connections to the module and thereby reducing unnecessary hardware.

The overlapping data input processing of the present invention described above greatly reduces the speed and hardware requirements. The speed is reduced by a factor M. The filter bank structure has the following digital hardware advantages for F=2: (1) Only K/2 unique demultiplexer outputs are required as opposed to K; this is very important since the number of demultiplexer outputs, and hence finite impulse response inputs, can become large even for modest filter bank sizes. Integration of functions on a single integrated circuit chip are limited not only by circuit density but by physical input/output processing; reducing the demultiplexer outputs also enables reduced circuitry and power dissipation. (2) Each polyphase filter is required to store half as many coefficients due to the fact that there are K unique filters in which to distribute the prototype filter coefficients as opposed to K/2 and this leads to a reduction in silicon chip area required to implement the filters.

The filter bank structure of the present invention does require a post-filter bank multiplication for the odd output channels since an inverse discrete Fourier transform was used, but as shown at 402 in FIG. 5, this can be implemented as an alternating sign change.

In summary, the proposed filter bank structure of the present invention for implementing a polyphase filter bank for K=FM consists of zero-padding each polyphase component with F-1 zeros and decimating by M the output across all K channels prior to taking the inverse discrete Fourier transform. The particular architecture of the present invention requires only N unique filter coefficients to produce the short time Fourier transform.

The novel filter bank structure discussed above results in a hardware efficient digital channelized receiver- only when used in combination with simple arbitration logic of the present invention described below. The purpose of any arbitration system is to detect a signal and determine which of K channels a signal occupies so that proper measurements can be made by a parameter encoder. The main components of an arbitration system are a signal detection system and instantaneous frequency measurement system. A signal detection system samples the amplitude of the signals from each channel and determines a pulse as occurring if A samples out of a set of B samples, continuous within a time window, exceed a predetermined threshold. The threshold is determined by balancing the probability of false alarm with the probability of detection. The purpose of the instantaneous frequency measurement is to provide an accurate measurement of the carrier frequency of the signal. The arbitration logic of the present invention combines the characteristics of the filter bank design with the decimation factor to allow a simple arbitration process to be utilized based solely on the instantaneous frequency measurement.

To facilitate implementation of the arbitration logic of the present invention, referring to FIG. 2, a signal can be assigned to channel k based solely on an instantaneous frequency measurement in channel k if the signal lies in the passband of channel k $$w_k - w_p \leq \hat{w}_o \leq w_k + w_p \qquad \text{Eq. 16}$$

or $$w_k - \pi/K \leq \hat{w}_o \leq w_k + \pi/K \qquad \text{Eq. 17}$$

where $w_k$ is $2\pi k/K$, $w_p$ is passband edge frequency $w_k + \pi/K$ and $w_o$ is the instantaneous frequency estimate.

An out of channel assignment would result for either $$\hat{w}_o > w_k + w_p \text{ or } \hat{w}_o < w_k - w_p \qquad \text{Eq. 18}$$

Neglecting for a moment the broad band energy caused by the leading and trailing edges of pulses, signal energy can, at most, be generated in channels adjacent to the channel in which the input signal truly resides. This can be seen by referring to FIG. 2 and noting that for signals which occur in channel k, and above the channel center $w_k$ at 220, responses are generated in channels k and k+1 only. On the other hand, signals which occur below $w_k$ generate responses only in channels k and k−1. Thus, in order to perform channel arbitration as outlined in Eq. 18, the instantaneous frequency measurement must be unambiguous over the range $$w_k - 2\pi/k \leq w_k^i \leq w_k + 2\pi/K \qquad \text{Eq. 19}$$

After demodulation and decimation by M, as discussed above, the constraint for each channel is $$-2\pi M/K \leq Mw_k^i \leq 2\pi M/K \qquad \text{Eq. 20}$$

Using Eqs. 17 and 18, the instantaneous frequency measurement for each channel will be unambiguous if $$F = K/M \geq 2 \qquad \text{Eq. 21}$$

Using maximal decimation with respect to Eq. 20, F=2 and the arbitration process based solely on a single sample instantaneous frequency measurement will assign a signal to channel k if $$-\pi/2 \leq Mw_k^i \leq \pi/2 \qquad \text{Eq. 22}$$

An out of channel assignment results for $$|Mw_k^i| \geq \pi/2 \qquad \text{Eq. 23}$$

Figure 6:
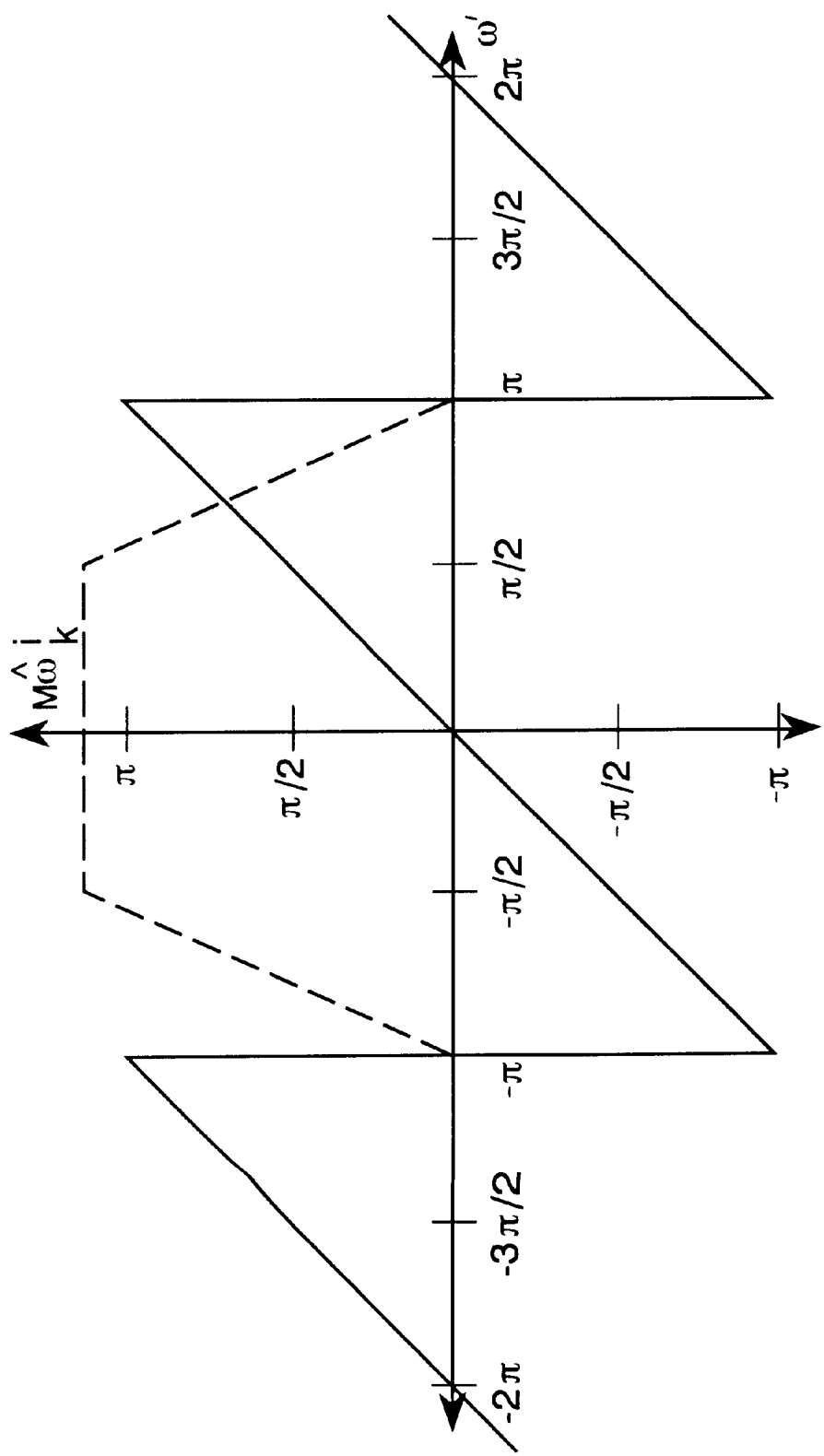
FIG. 6 shows a filter instantaneous frequency response for F=2 according to the present invention.

The mapping of $Mw_k^i$ versus w' is shown in FIG. 6 for F=2. Note the folding of the instantaneous frequency measurement response because the frequency is periodic in intervals of $2\pi$. Its relation to the passband and stopband frequencies of the overlayed filter magnitude response is that the stopbands coincide with the $2\pi$ periodicity frequencies of the instantaneous frequency measurement. The passband frequencies define in which channel the signal resides.

Figure 7:
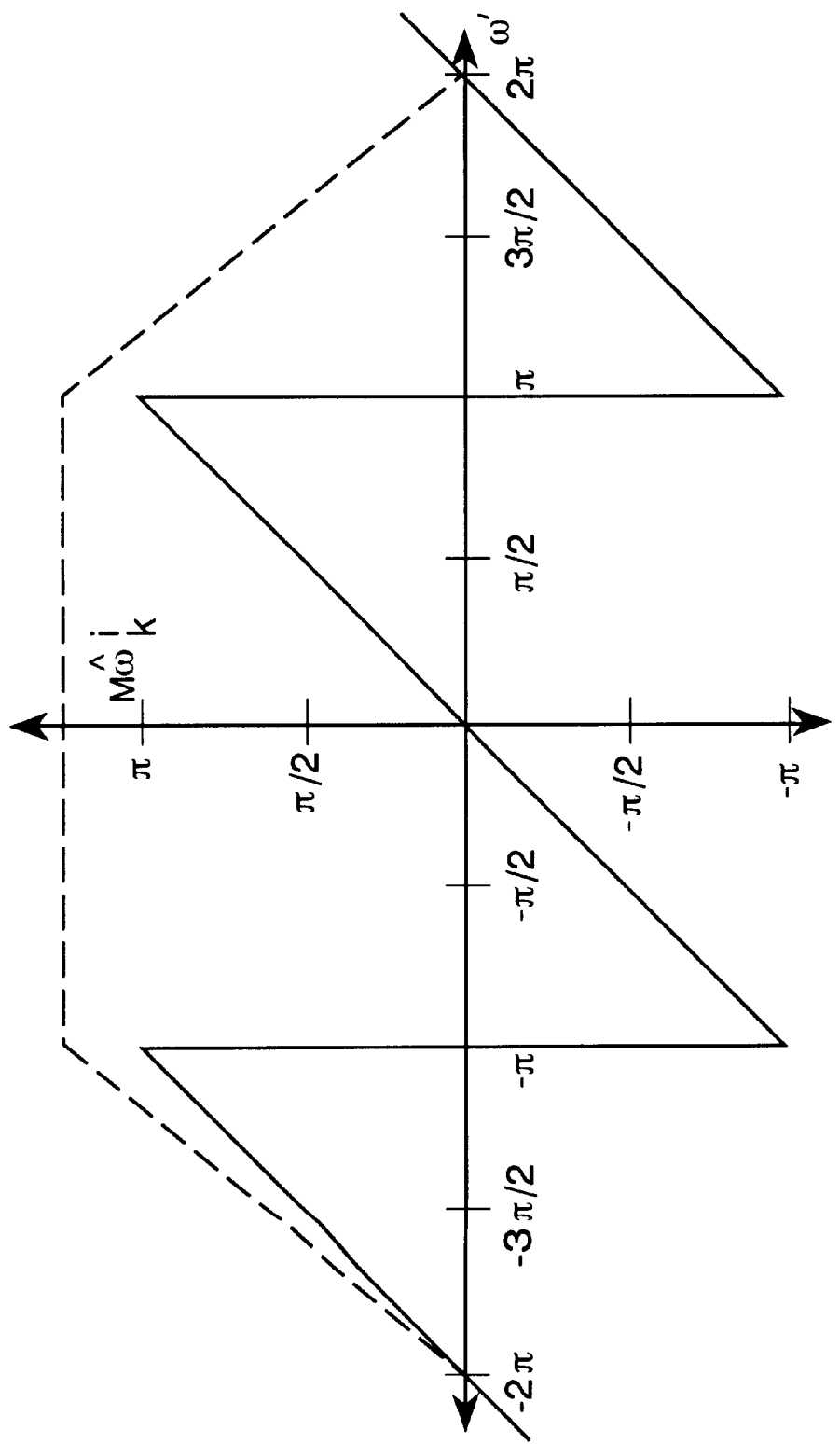
FIG. 7 shows a filter instantaneous frequency response for F=1.

In addition to allowing unambiguous instantaneous frequency measurement in each channel, the optimal filter/decimation ratio, K/M=2, also reduces the processing speed requirements by a factor K/2. Though it can be shown that the maximum decimation relation for general analysis/synthesis applications is F=1, arbitration and reliable frequency measurement at the channel passband edges is not possible for F=1. This is due to the folding of the instantaneous frequency measurement response at the channel passband edges as opposed to the stopband edges for F=2. The mapping of $Mw_k^i$ versus w' for F=1 is shown in FIG. 7. The frequency measurement beyond the channel passband is ambiguous which makes the arbitration process, based solely on the instantaneous frequency measurement, ambiguous. To use F=1, amplitude comparison must be used in conjunction with instantaneous frequency measurement arbitration to solve the ambiguity which requires more hardware to implement the arbitration function. The use of amplitude comparison is an arbitration function eliminated in the present invention using F=2.

The second consideration regarding the selection of F is the validity of the frequency measurement itself. If an input occurs on either side of the channel passband edges (adjacent channel crossover points), the instantaneous frequency measurement will toggle between $-\pi$ and $\pi$. For signals embedded in noise, this occurs not only at the passband edges but also in a region, near the passband edges, which widens with decreasing signal-to-noise ratio. Further, often a simple and accurate method of obtaining an estimate of a signal's carrier frequency is to average the instantaneous frequency measurements over a number of samples. For F=1, the estimate will be highly biased for signals in the channels crossover regions. This is not the case for F=2, since the response is continuous to the stopband edge. Therefore, for the above stated reasons, the maximum decimation factor used in the structure of the filter bank and practical for implementation of the arbitration logic is F=2.

Figure 8:
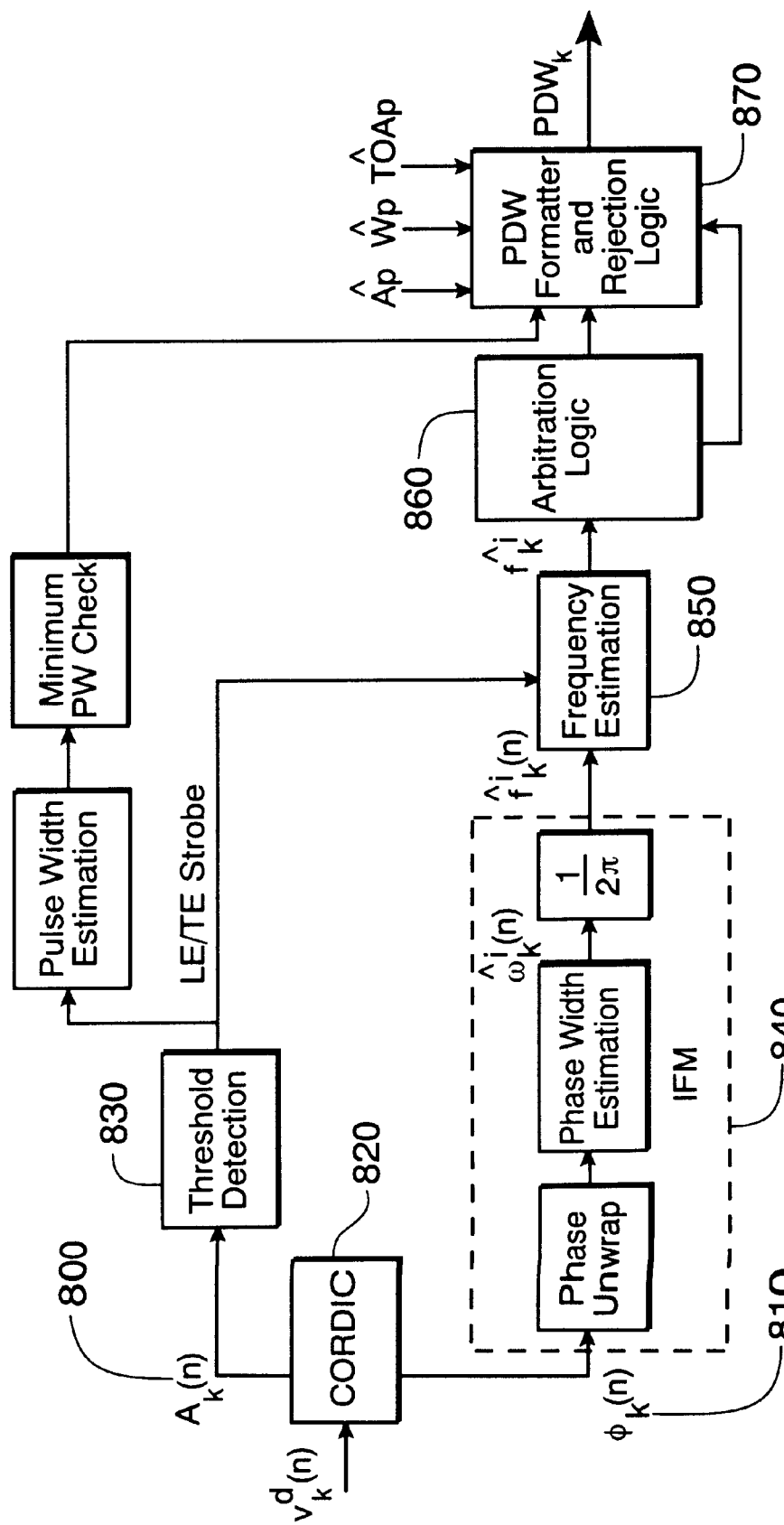
FIG. 8 shows a channel detection, arbitration and parameter estimation module diagram according to the present invention.
Figure 9:
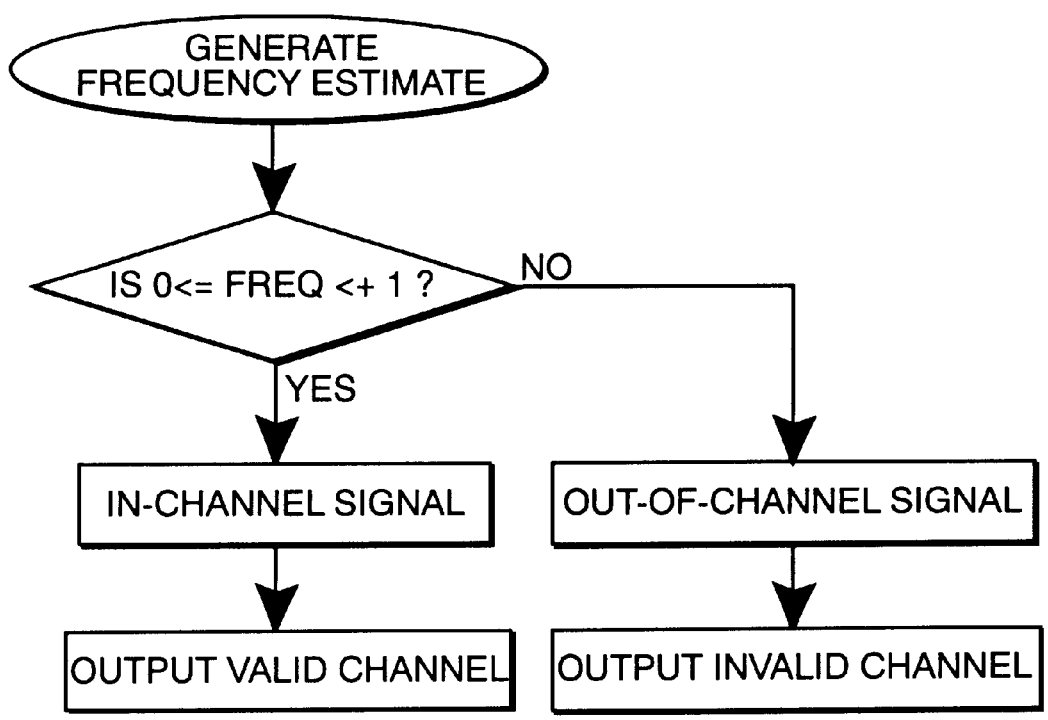
FIG. 9 shows a flow chart for arbitration logic for high signal to noise conditions.

Implementation of the digital channelized receiver is shown in FIG. 5. Here, digitized data is first demultiplexed into K/2 data streams and then passed through the K polyphase filter components. A fast Fourier transform is then performed on each filtered data block of length K to produce K outputs equivalent to decimated filter outputs. The K/2 unique complex fast Fourier transform outputs $v_k^d[n]$ at 501 being the real and imaginary channel components $R_k[m]$ and $I_k[m]$, enter the parameter encoder module as shown in detail in FIG. 8. These components are converted into an associated magnitude and phase $A_k(m)$ at 800 in FIG. 8 and $\psi_k(m)$ at 810 by a Coordinate Rotation Digital Computer (CORDIC) algorithm illustrated at 820 which functionally solves the following equations:

$$A_k[n] = \sqrt{R_k^2[n] + I_k^2[n]} \qquad \text{Eq. 24}$$

$$\phi_k[n] = \tan^{-1}\left\{\frac{I_k[n]}{R_k[n]}\right\} \qquad \text{Eq. 25}$$

The magnitude samples are routed to a signal detection logic algorithm at 830 and the phase samples to the instantaneous frequency measurement operation at 840. The instantaneous frequency measurement unwraps the phase, or in other words reestablishes the linear dependency of the phase on the radian frequency, $w_o$, and the sample number, and then implements the backwards difference operation $$w_k^i = \frac{\phi_k^d[n] - \phi_k^d[n-1]}{M} = \frac{\Delta\phi_k^d[n]}{M} \qquad \text{Eq. 26}$$

Eq. 26 scales the output by $1/2\pi$, where $w_k^i$ is the instantaneous digital frequency and $\phi_k^d$ represents the instantaneous phase at time index Mn. The output of the instantaneous frequency measurement, $f_k^i[n]$ is the instantaneous frequency measurement on a sample by sample basis. The appendix program obr.m performs the arbitration logic between channels in the accompanying computer simulation. The outputs of the instantaneous frequency measurement are averaged to provide a more accurate frequency estimate for an entire input pulse. The detection logic provides leading and trailing edge strobes to the frequency estimator logic at 850 which defines the number of samples of $f_k^i[n]$ that are to be averaged. The number of samples averaged is defined by the frequency estimation accuracy required, and the length of the pulse. The pulse frequency estimate is given by $$f_k^{av} = \frac{1}{N}\left[\sum_{n=0}^{N-1} 2f_k^i[n] + 1/2\right] \qquad \text{Eq. 27}$$

where N is the number of samples of $f_k^i[n]$ between the leading and trailing edge strobes. In the accompanying computer software, the pulse frequency estimate maps in-channel frequencies from the frequency interval $-¼$ to $¼$ to the interval 0 to 1. Out of channel frequencies from $-½$ to $-¼$ and $¼$ to $½$ are mapped to the interval $-½$ to 0 and $3/2$ to 1. The pulse frequency estimates $f_k^{av}$ are then sent to the arbitration logic at 860 which determines if the signal is in-channel (valid) or out-of-channel (invalid). Eqs. 22 and 23 describe the arbitration process for a simple instantaneous frequency measurement. In the implementation of the arbitration process, Eq. 27 is used to scale and average the frequency estimates. The arbitration logic based on $f_k$ will assign a signal to channel k if $$0 \leq f_k^{av} \leq 1 \qquad \text{Eq. 28}$$

An out of channel assignment results for $$-.5 \leq f_k^{av} \leq 0 \text{ or } 1 \leq f_k^{av} \leq 1.5 \qquad \text{Eq. 29}$$

In other words, the frequency estimate is normalized to values between 0 and 1 for in-channel signals and $-0.5$ to 0 and 1 to 1.5 for out-of-channel signals. If the signal is valid, as determined by the arbitration logic, the estimates are formatted and passed onto the pulse descriptor word formatter at 870 in FIG. 8 for output to the pulse descriptor word bus. The pulse descriptor word contains the measurements of the pulse such as carrier frequency, amplitude and width. If signals are found invalid, the estimates are dropped. The appendix program pdw16.m estimates the signal parameters frequency, pulse-width, time-of-arrival and pulse amplitude in the accompanying computer simulation.

Figure 10:
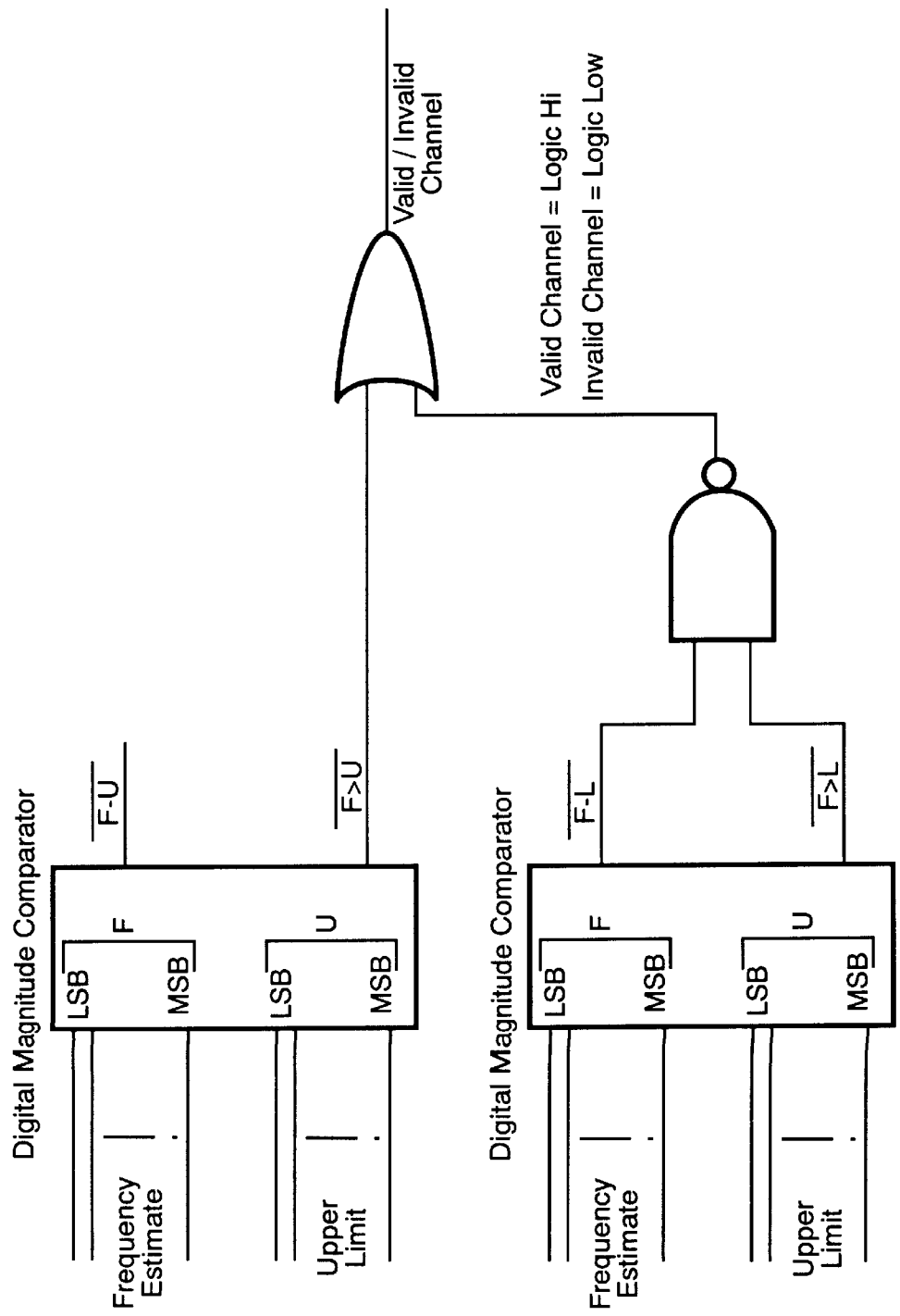
FIG. 10 shows a hardware implementation of arbitration logic for the present invention.
Figure 11:
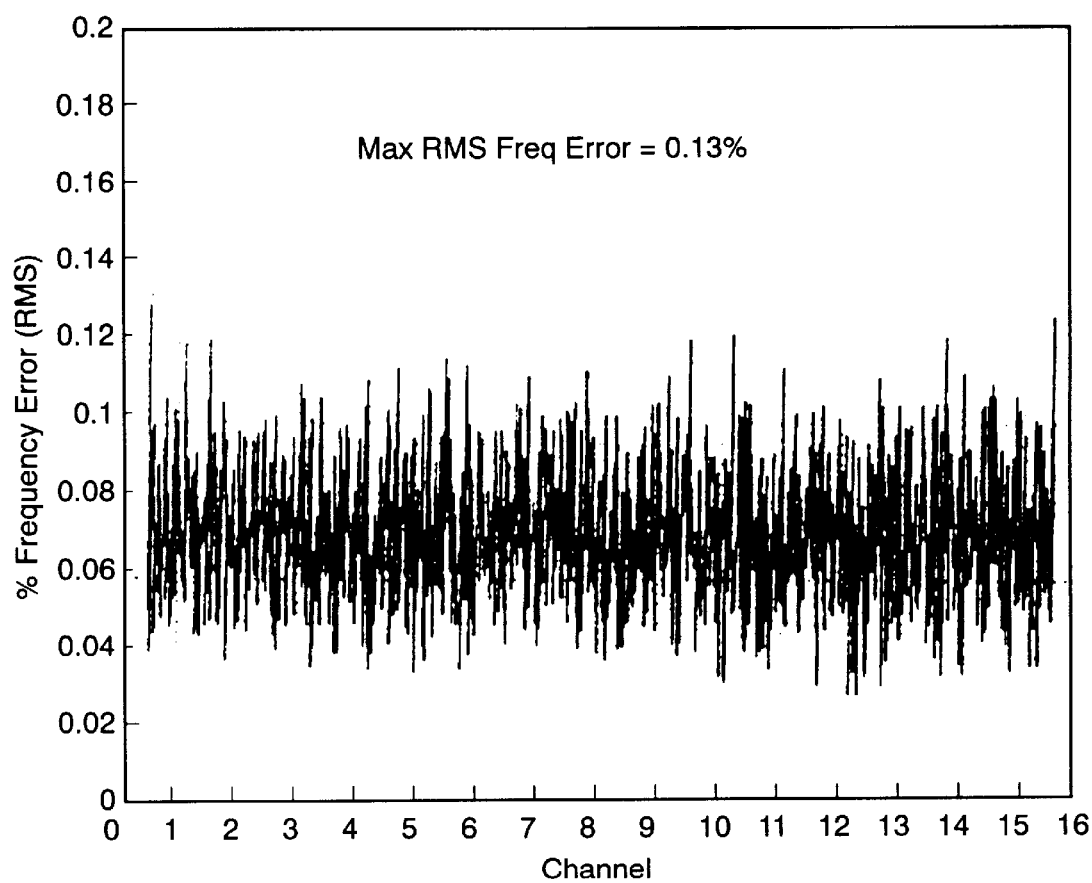
FIG. 11 shows root mean square frequency error results for the present invention.

This arbitration logic, implemented using hardware as shown in FIG. 10, is extremely simple and does not require communication between adjacent channels. The performance of the frequency estimation and arbitration logic is documented via results of a frequency error test, a single signal dynamic range test and an instantaneous dynamic range test. These tests were performed across the entire filter bank bandwidth. The frequency estimation accuracy of the present invention is illustrated by the results of the root mean square frequency error test. The root mean square error represents the variance of the frequency estimates. The root mean square frequency error results, across the desired frequency range, are shown in FIG. 11. The maximum root mean square pulse frequency error reported is 0.13% of the channel bandwidth.

Figure 12:
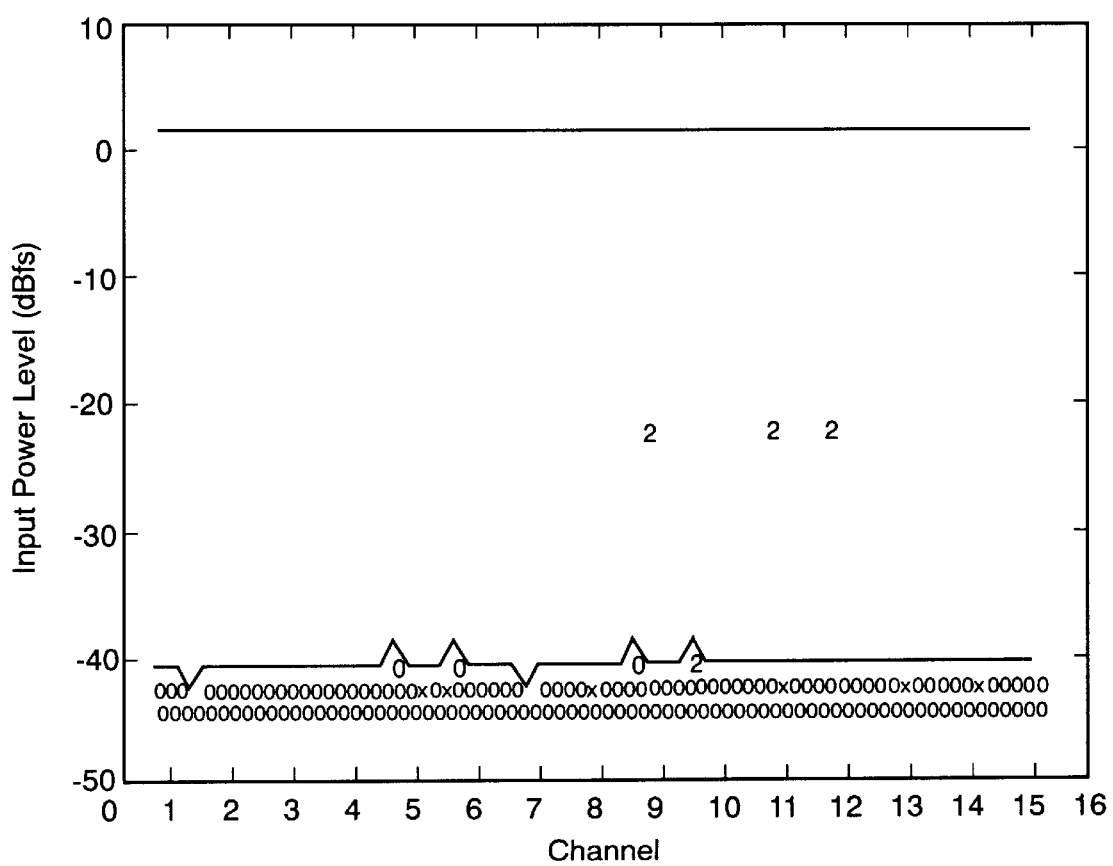
FIG. 12 shows single signal dynamic range test results.

The ability of the present invention to detect and encode, within a given accuracy, a single signal across the desired frequency and power range, is illustrated by the results of a single signal dynamic range test. The single signal dynamic range test is the minimum power range, across the filter bank bandwidth, over which one input signal can be detected and signal parameters encoded to within a given accuracy. FIG. 12 shows the results of the single signal dynamic range test in which the pulse descriptor word outputs are checked for the following spurious events:

0=no output pulse descriptor word;

X=inaccurate frequency measurement; and

2=multiple pulse descriptor words generated.

In FIG. 12, the single signal dynamic range test is the difference in dB between the upper and lower solid lines. As can be seen from the plot, only three spurious events were detected across the entire bandwidth and the single signal dynamic range test is roughly 42 dB. The very low number of spurious error events shows the robustness of the arbitration logic and the frequency measurement.

Figure 13:
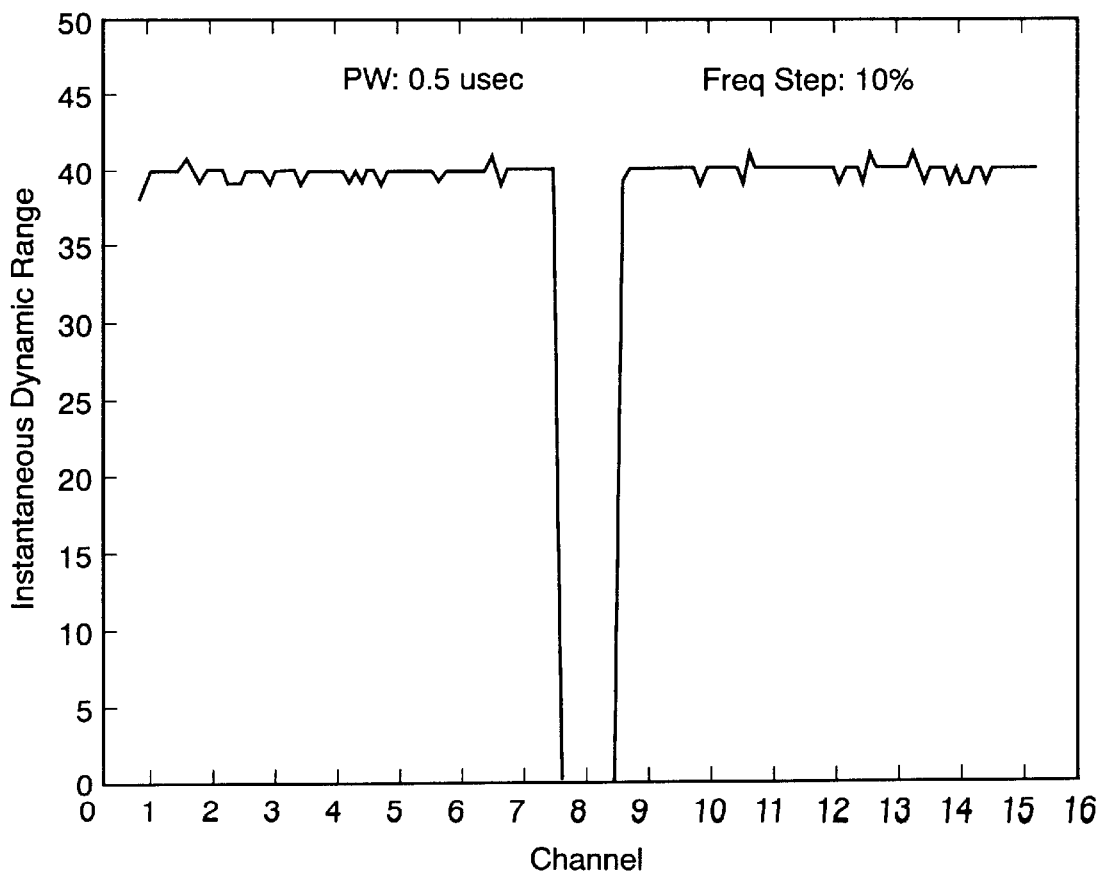
FIG. 13 shows instantaneous dynamic range test results.

The ability of the present invention to detect and encode two simultaneous input signals, at different frequencies and different power levels, within a given accuracy, is illustrated by the results of the instantaneous dynamic range test. The instantaneous dynamic range test is the minimum power range, across the filter bank bandwidth, over which two simultaneous input signals, at different frequencies and different power levels, can be detected and encoded within a given accuracy. FIG. 13 shows the instantaneous dynamic range test, in dB, across the entire frequency range of interest. As can be seen in FIG. 13, the instantaneous frequency measurement-based arbitration logic can resolve two signals separated by one half channel width over a power range of 40 dB.

The present invention details a novel polyphase filter bank structure required for a channelized receiver. The structure is novel because it combines the basic polyphase structure with overlapping of the input data, thus allowing the decimation factor M and the number of filters K to be related by K=FM, where F is the data overlap factor. This is an improvement over the Short-Time Fourier Transform and the polyphase filter approaches to filter banks and avoids the requirement of interpolating the input data, leading to advantages in the actual hardware implementation of the filter bank and processing speed. By using the proposed structure, the phase difference response across each filter bank channel is altered so that it is not discontinuous at the channel passband edges. This allows a very simple, novel, arbitration logic scheme to be used, based only on the instantaneous frequency measurement, and also allows accurate frequency measurement at the channel passband edges.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. A hardware efficient digital channelized receiver comprising:
   frequency converter means connected to a radio frequency input signal source for converting said input signals to signals of a lower intermediate frequency;
   analog-to-digital converter means coupled to said frequency converter means for converting said lower intermediate frequency signals into digital signals;
   decimating means coupled to said analog-to-digital converter means for reducing the processing speed requirements of each said digital signal by a factor M;
   digital filter bank means for performing an inverse discrete Fourier transform containing K number of polyphase bandpass filters coupled to said decimating means for generating a plurality of polyphased digital channel signals from said digital signals;
   means, including a plurality of exponential operator-inclusive modulators coupled to individual channel outputs of said K number of polyphase bandpass filters for translating said channelized digital signals from bandpass frequencies to baseband frequencies of selected limited frequency spectrum;
   converter means coupled to said digital filter bank means for converting said plurality of polyphased digital channel signals into phase component signals and magnitude component signals;
   signal detection logic means having inputs coupled to said converter means magnitude component signals for sampling signal amplitude;
   digital instantaneous frequency measurement means coupled to said signal detection logic means for processing said converter means phase component signals to instantaneous frequency signals; and
   arbitration means coupled to output signals of said digital instantaneous frequency measurement means for segregating valid from invalid signals therefrom, said segregation being based on location of a signal within or without of a channel.

2. The hardware efficient digital channelized receiver of claim 1, wherein said inverse discrete Fourier transform is performed using a fast Fourier transform.

3. The hardware efficient digital channelized receiver of claim 2, wherein digital signals input to said digital filter bank means are overlapped in time by a factor of two.

4. The hardware efficient digital channelized receiver of claim 3, wherein said digital signals are commutated in a high to low frequency sequence direction to K/2 polyphase filter channels.

5. The hardware efficient digital channelized receiver of claim 4, wherein commutation is implemented using a demultiplexer.

6. The hardware efficient digital channelized receiver of claim 5, further including signal averaging means for combining a selected sample sequence of output signals from said digital instantaneous frequency measurement means into a single frequency estimate signal of enhanced accuracy.

7. The hardware efficient digital channelized receiver of claim 6, wherein said selected sample sequence is comprised of a number of samples determined in response to an output signal of said signal detection logic means.

8. The hardware efficient digital channelized receiver of claim 1 wherein K=FM and wherein K is quantity of polyphase filters, F is a data overlap factor and M is a decimating factor.

9. The hardware efficient digital channelized receiver of claim 7, wherein said digital instantaneous frequency measurement means further comprises
   means for reestablishing linear dependency of said phase component on radian frequency $\hat{w}_o$;
   means for implementing a backwards difference operation of said frequency estimate; and
   means for scaling said frequency estimate by a mathematical factor of $1/2\pi$.

10. The hardware efficient digital channelized receiver of claim 9, wherein said backwards difference operation is computed from a mathematical relationship of $$w_k^i = \frac{\phi_k^d[n] - \phi_k^d[n-1]}{M} = \frac{\Delta\phi_k^d[n]}{M}$$

where $w_k^i$ is instantaneous digital frequency, $\phi_k^d$ is instantaneous phase and M is a decimating factor.

11. The hardware efficient digital channelized receiver of claim 10, wherein a frequency estimate is computed from a mathematical relationship of $$f_k^{av} = \frac{1}{N}\left[\sum_{n=0}^{N-1} 2f_k^i[n] + 1/2\right]$$

where $f_k^{av}$ is frequency estimate, N is number of samples and $f_k^i$ is sampled frequency.

12. The hardware efficient digital channelized receiver of claim 11, wherein zero filter coefficients are combined with non-zero filter coefficients to produce a filter of length 2N wherein N represents the length of the filter.

13. The hardware efficient channelized receiver of claim 1, further including a Cordic Rotation Digital Computer algorithm means for converting decimated, channelized signals from said bank of filters into phase and magnitude signal components.

14. A hardware efficient digital channelized receiver method for receiving radio frequency signals, said method comprising the steps of:
   converting radio frequency input signals to signals of a lower intermediate frequency;
   converting lower intermediate frequency signals from analog signals into digital signals using analog-to-digital converter means;
   decimating each said digital signal by a factor M;
   generating with an inverse discrete Fourier transform a plurality of polyphased digital channel signals from said scaled digital signals;
   translating with a plurality of exponential operators said channelized digital signals from bandpass frequencies to baseband frequencies of selected limited frequency spectrum;
   converting said plurality of polyphased digital channel signals into phase component signals and magnitude component signals;
   processing said phase component signals from complex fast Fourier transform outputs to digital instantaneous frequency signals; and
   segregating valid from invalid signals in said digital instantaneous frequency signals by determining the location of a signal within or without of a channel.

15. The hardware efficient digital channelized receiver method as in claim 14, wherein said decimating and generating steps are performed by the steps of:

multiplying N data points by filter coefficients of polyphased digital channels;

performing a fast Fourier transform on said points of multiplied data; and eliminating next M number of data points where M is a decimation factor; and repeating said multiplying and performing steps on data points remaining after said eliminating step.

16. The hardware efficient digital channelized receiver method as in claim 15, wherein determining a number of samples averaged comprises the steps of:

gating signals from a signal detection system into a frequency estimating system with signal pulse leading edge and trailing edge strobes;

selecting a number of signals to average from said gating step; and computing the equation $$f_k^{av} = \frac{1}{N}\left[\sum_{n=0}^{N-1} 2f_k^i[n] + 1/2\right]$$

where $f_k^{av}$ is a frequency estimate, N is the number of samples between the leading and trailing edge strobes and $f_k^i$ is the sampled frequency.

17. The hardware efficient digital channelized receiver method as in claim 16 wherein $f_k^{av}$ is valid and assigned to channel k when $f_k^{av}$ falls within the magnitude range $0 \leq f_k^{av} \leq 1$.

18. The hardware efficient digital channelized receiver method as in claim 17 wherein $f_k^{av}$ is invalid and dropped from further consideration when $f_k^{av}$ falls within one of the magnitude ranges of $-0.5 \leq f_k^{av} \leq 0$ and $1 \leq f_k^{av} \leq 1.5$.

* * * * *

UNITED SATES PATENT AND TRADEMARK OFFICE
CERTIFICATE OF CORRECTION

PATENT NO. : 6,085,077

DATED : July 4, 2000

INVENTOR(S) : Timothy W. Fields et al

It is certified that error appears in the above-identified patent and that said Letters Patent is hereby corrected as shown below:

*In the masthead, the following assignee information should appear ---the United States of America as represented by the Secretary of the Air Force.*

*In the masthead, the following attorney information should appear ---Attorney, Agent, or Firm - Gina S. Tollefson, Gerald B. Hollins, and Thomas L. Kundert.*

*At column 4, line 44, "parameter" should be ---parameters---*

*At column 9, line 26, "$w_o$" should be ---$\hat{w}_o$---*

*At column 10, line 2, "$27\pi$" should be ---$2\pi$---.*

*At column 10, line 52, "$\Psi_K(m)$" should be ---$\varphi_K(m)$.*

Signed and Sealed this

Tenth Day of April, 2001

Attest:

NICHOLAS P. GODICI

*Attesting Officer*   Acting Director of the United States Patent and Trademark Office